US008102541B2

(12) United States Patent
Heiden

(10) Patent No.: US 8,102,541 B2
(45) Date of Patent: Jan. 24, 2012

(54) APPARATUS AND METHOD FOR MEASURING STRUCTURES ON A MASK AND OR FOR CALCULATING STRUCTURES IN A PHOTORESIST RESULTING FROM THE STRUCTURES

(75) Inventor: Michael Heiden, Wolfersheim (DE)

(73) Assignee: Vistec Semiconductor Systems GmbH, Weilburg (DE)

( * ) Notice: Subject to any disclaimer, the term of this patent is extended or adjusted under 35 U.S.C. 154(b) by 624 days.

(21) Appl. No.: 12/014,359

(22) Filed: Jan. 15, 2008

(65) Prior Publication Data

US 2008/0204735 A1 Aug. 28, 2008

Related U.S. Application Data

(60) Provisional application No. 60/891,164, filed on Feb. 22, 2007.

(30) Foreign Application Priority Data

Feb. 22, 2007 (DE) ......................... 10 2007 009 254
Nov. 7, 2007 (DE) ......................... 10 2007 000 981

(51) Int. Cl.
*G01B 11/14* (2006.01)

(52) U.S. Cl. ....................................................... 356/625

(58) Field of Classification Search ........................ None
See application file for complete search history.

(56) References Cited

U.S. PATENT DOCUMENTS 4,618,938 A * 10/1986 Sandland et al. ............. 382/148
5,892,579 A * 4/1999 Elyasaf et al. ............. 356/239.8
6,323,953 B1 11/2001 Blaesing-Bangert et al.
6,466,315 B1 * 10/2002 Karpol et al. .............. 356/237.4
(Continued)

FOREIGN PATENT DOCUMENTS

DE 102005025535 A1 12/2006
(Continued)

OTHER PUBLICATIONS

Katsumi et al., Photomask Quality Assessment Solution for 90nm Technology Node, 2004, Photomask and Next-Generation Lithography Mask Technology XI, Proceedings of SPIE vol. 5446, pp. 364-374.*

(Continued)

*Primary Examiner* — Gregory J Toatley
*Assistant Examiner* — Juan D Valentin
(74) *Attorney, Agent, or Firm* — Houston Eliseeva, LLP

(57) ABSTRACT

An apparatus (1) for measuring structures (3) on a mask (2) and for calculating structures in a photoresist on a wafer resulting from the structures (3) on the mask (2) is disclosed, wherein the apparatus (1) comprises at least one incident-light illumination means (14) and/or one transmitted-light illumination means (6), wherein the apparatus (1) comprises at least one imaging optics (9) and a detector (11) of a camera (10) for imaging the structures (3) on the mask (2), wherein a first computer program (17) is associated with the detector (11) of the camera (10) and provided for determining the position and/or the dimension of the structure (3) on the mask (2). A method for measuring structures (3) on a mask (2) and for calculating structures in a photoresist on a wafer to be expected from the structures (3) on the mask (2) is also disclosed.

23 Claims, 3 Drawing Sheets

U.S. PATENT DOCUMENTS

| | | | | |
|---|---|---|---|---|
| 2004/0243320 | A1 | 12/2004 | Chang et al. | |
| 2006/0048090 | A1 * | 3/2006 | Feldman | 716/21 |
| 2006/0239535 | A1 * | 10/2006 | Takada et al. | 356/237.1 |
| 2006/0269117 | A1 | 11/2006 | Seitz et al. | |
| 2006/0274934 | A1 | 12/2006 | Boesser et al. | |
| 2008/0107077 | A1 * | 5/2008 | Murphy | 370/331 |

FOREIGN PATENT DOCUMENTS

| | | | |
|---|---|---|---|
| EP | 0 628 806 | A2 | 12/1994 |
| WO | 00/60415 | A1 | 10/2000 |
| WO | 2006/089630 | A1 | 8/2006 |

OTHER PUBLICATIONS

Blasing, C., "Pattern Placement Metrology for Mask Making," SEMI, Mar. 31, 1998.

Mirande, W., "Edge Measurement on Microstructures," VDI Berichte Nr. 1102 (1993), pp. 137-159.

Pettibone, D. et al., "Wafer Printability Simulation Accuracy Based on UV Optical Inspection Images of Reticle Defects," Part of the SPIE Conference on Metrology, Inspection, and Process Control for Microlithography XIII, Santa Clara, California, Mar. 1999, SPIE vol. 3677, pp. 711-720.

* cited by examiner

APPARATUS AND METHOD FOR MEASURING STRUCTURES ON A MASK AND OR FOR CALCULATING STRUCTURES IN A PHOTORESIST RESULTING FROM THE STRUCTURES

RELATED APPLICATIONS

This application claims priority to German Patent Application No. DE 10 2007 009 254.9, filed on Feb. 22, 2007, and German Patent Application No. DE 10 2007 000 981.1, filed on Nov. 7, 2007, and claims the benefit under 35 USC 119(e) of U.S. Provisional Application No. 60/891,164 filed on Feb. 22, 2007, all of which are incorporated herein by reference in their entirety.

BACKGROUND OF THE INVENTION

The present invention relates to an apparatus for measuring structures on a mask and for calculating the structures in a photoresist on a wafer resulting from the structures on the mask.

The present invention further relates to a method for measuring structures on a mask and for determining the structures in a photoresist on a wafer resulting from the structures on the mask.

A measuring device according to the prior art measures structures on a substrate, wherein the measuring device comprises incident-light and/or transmitted-light illumination means, an imaging means and a detector means for the imaged structures, and a measuring stage interferometrically controlled and translatable in a measured fashion in a plane vertical to the optical axis of the imaging means and relative to it for receiving the substrate. The measuring device is not suited, however, to determine how the structures on the substrate (mask) are ultimately imaged in the photoresist on the wafer by the stepper.

A measuring device of this type was described in detail, for example, in the text of the paper entitled "Pattern Placement Metrology for Mask Making", presented by Dr. Carola Bläsing at the Semicon meeting, Education Program in Geneva, Switzerland on Mar. 31, 1998. The measuring device is set up in a climate chamber in order to achieve measurement accuracy in the nanometer range. The position coordinates of various structures or features on masks and wafers are measured. The measuring system is mounted on a vibration-damped granite block. The masks and wafers are placed on the measuring stage by an automatic handling system.

German Patent Application DE 19819492 discloses a measuring machine for structural widths or the positions of structures on the substrate. The measuring stage glides on air bearings on the surface of the granite block. Planar mirrors are mounted on two mutually vertical sides of the measuring stage. A laser interferometer system determines the position of the measuring stage. Different guiding of the measuring stage is also conceivable, which is suitable for clean room environments. The illumination and imaging of the structures to be measured is carried out by a high-resolution, apo-chromatically corrected microscope optics in the incident-light or transmitted-light modes in the spectral range of the near UV. A CCD camera serves as a detector. Measuring signals are obtained from the pixels of the detector array arranged within a measuring window. An intensity profile of the measured structure is derived by means of image processing, from which the edge position of the structure can be determined, for example.

The measured edge position is on the one hand dependent on the physical quality of the edge itself and on the other hand on the optical measuring method used, as well as on the quality of the imaging system. These relationships are described in the paper "Edge Measurement on Microstructures", W. Mirandé, VDI Berichte Nr. 1102 (1993), pages 137 et seq. If the position of the structure is defined by the center line between the two edges, influences on the measured edge position have generally no effect on the measured position of the structure. The evaluation of the measuring results for a structure width measurement can lead, however, to different results in different measuring devices.

In semiconductor manufacture, the mask is illuminated in the stepper with transmitted light and imaged on the wafer. It is therefore of particular interest to be able to determine the precise opaque width of the structural element. Special measuring microscopes have been developed, wherein the mask is illuminated with transmitted light and only the width of the opaque structure image is measured. These measuring devices are not for determining the position coordinates of the structural elements. These considerations apply in the same manner if transparent structural elements instead of opaque structural elements are to be measured in the mask surface.

German Patent Application DE 10 2005 009 536 A1 discloses a method for mask inspection, which can be used in the context of the mask design of mask manufacture, so that relevant problematic points can be detected and corrected at an early stage. As a result, it should be possible to detect and eliminate defects already in the mask layout and mask design, so that the masks to be made have a lower total number of defects and costs are minimized.

For the analysis of mask defects with respect to printability, the AIMS<TM>(Aerial Imaging Measurement System) of Carl Zeiss SMS GmbH has been established in the market for ten years. Herein, a small area of the mask (defect position with surroundings) is illuminated and imaged with the same illumination and imaging conditions (wavelength, NA (numerical aperture), type of illumination, degree of coherence of the light (sigma)) as in the lithographic scanner. Unlike the process in the scanner, the aerial image generated of the mask is enlarged onto a CCD camera. The camera sees the same latent image as the photoresist on the wafer. This is how the aerial image can be analyzed without cumbersome test prints by wafer imaging devices, and it is possible to draw conclusions as to the printability of the mask. By recording a focus series, additional information for analyzing the lithographic process window is obtained (cf. DE 10332059 A1).

German Patent Application DE 10332059 A1 discloses a method of analyzing objects in micro-lithography, preferably masks, by means of an aerial image measurement system (AIMS), comprising at least two imaging stages, wherein the detected image is corrected with respect to the transmission behavior of the second or further imaging stages by means of a correction filter, and illuminating the object is carried out in the incident-light and/or transmitted-light modes, wherein the correction is carried out in such a way that the corrected output values correspond to the image of a photolithography stepper or scanner, wherein the correction is carried out by reverse convolution, and measured or calculated correction values are used for the correction.

European Patent Application EP 0 628 806 discloses an apparatus and a method for determining the characteristics of a photolithographic mask. In the AIMS mask inspection microscope, this involves, for example, the adjustment and observation of certain illumination settings. The light for illumination is taken from the UV range. The detector or the imaging unit is a UV CCD camera.

In International Patent Application WO 00/60415 A1, a method for correcting imaging errors is described, wherein, by changing an electronic mask design after illuminating this mask design through a mask printer, structures are imaged on the mask, which come as close as possible to the original mask design or setpoint mask. The process conditions to be observed are set out in the form of tables comprising, in particular, the parameters dependent on the process conditions in the form of correction values. For example, various correction values for compensating the device dependent aberration of the mask printer are included in the table in a location dependent manner. The approach uses physically based models of the corresponding imaging errors as a precondition for all correction values. While it is possible with the suggested method, unlike prior art methods, to correct effectively mask structures for manufacturing large-scale integrated circuits, computation overhead is considerable. A further drawback of this method is the great number of parameters to be taken into account in the form of correction values. Apart from diffraction and refraction effects, interaction effects and device-dependent aberration effects are also to be taken into account.

Hitherto unpublished German Patent Application DE 10 2007 028 260 discloses an apparatus for measuring the positions and structural widths of at least one structure on a surface of a substrate. The substrate is inserted in the measuring stage in such a way that a normal vector extending from the surface of the substrate carrying the structures is essentially parallel to the vector of gravitational force.

None of the apparatus and/or methods known from the state of the art can determine the position or CD (critical dimension) of structures on a mask in one and the same apparatus and also predict the result to be obtained if the mask were to be imaged in a photoresist on the wafer by means of a stepper.

SUMMARY OF THE INVENTION

It is therefore an object of the present invention to provide an apparatus which allows for determining the positions and structural widths of structures on a mask, wherein the apparatus should also be suitable to calculate the result of a structure on the mask printed by a stepper.

This object is solved by an apparatus comprising at least one incident-light illumination means and/or one transmitted-light illumination means. Furthermore, at least one imaging optics is provided, wherein the imaging optics is configured for imaging the structure on a mask according to a wavelength of a stepper illumination used in a stepper. A detector of a camera images the structures on the mask, wherein a first computer program is associated with the detector of the camera for determining the position and/or the dimension of the structures on the mask. A second computer program being associated with the detector of the camera for calculating the structure to be expected in the photoresist on the wafer on the basis of the wavelength of the stepper illumination used in the stepper.

It is another object of the present invention to provide a method allowing positions and structural widths of structures on a mask to be determined, wherein the method should also be suitable to calculate the result of a structure on a mask printed by means of a stepper.

This object is achieved by an apparatus which comprises the following steps:

- illuminating at least one structure on the mask for semiconductor manufacture with at least one incident-light illumination means and/or one transmitted-light illumination means;
- imaging the structure on the mask onto a detector of a camera with the aid of at least one imaging optics;
- in measuring the structures on the mask with respect to the position and/or dimension, determining the values with a first computer program associated with the detector of the camera,
- illuminating the structure on the wafer with at least one imaging optics while using a wavelength of a stepper illumination used in a stepper; and
- calculating the structure to be expected in the photoresist on the wafer with the wavelength of the stepper illumination used in the stepper and with respect to the image of the structure on the mask onto the detector of the camera with a second computer program associated with the detector of the camera.

The apparatus according to the present invention comprises at least one incident-light illumination means and/or one transmitted-light illumination means for illuminating structures on a mask. In one embodiment the at least one incident-light illumination means and/or transmitted-light illumination means emit light in a common optical axis. In another embodiment the at least one incident-light illumination means and/or one transmitted-light illumination means comprise an Excimer laser. This is particularly advantageous since the laser can also be used for illumination in the stepper. In another embodiment, a measuring stage is also provided, which is interferometrically controllable and displaceable in a plane vertical and relative to the optical axis for supporting the mask to access the structures on the mask. Thus, traversal of the measuring stage is interferometrically controlled and measured. The apparatus additionally comprises at least one imaging optics and a detector of a camera, so that structures on the mask can be imaged by means of the at least one imaging optics onto the detector of the camera. In another embodiment, the camera is a CCD camera sensitive to light in wavelengths equal to or smaller than 400 nm. In another embodiment the mask is used for wafer manufacture. The apparatus according to the present invention further comprises a first computer program associated with the detector of the camera and provided for determining the position and/or the dimension of the structure on the mask. Thus, the apparatus according to the present invention measures the structures on the mask by means of the above described elements from the prior art.

Hitherto only the position and/or the dimension and/or the CD of each structure on the mask is calculated from the thus obtained measuring result data. The structure to be expected in a photoresist on a wafer can be theoretically calculated based on the stepper illumination, which would result in the illumination in the stepper in a photoresist on the wafer. The width (CD) of the structure on a mask calculated from the image of the CCD camera is compared with the theoretically calculated width of the structure to be expected in the photoresist on the wafer. It can be estimated from this comparison how precisely the individual structures on the mask will ultimately be created in the photoresist on the wafer.

The at least one imaging optics for imaging the structures on the wafer is configured according to a wavelength of a stepper illumination used in a stepper. Thus, the at least one imaging optics can use the same wavelength as the stepper illumination. To allow the wavelength used in the stepper illumination to be adjusted quickly and easily, in one embodiment, at least two lenses are provided in the at least one imaging optics, which can be brought into the optical axis. One of the at least two lenses is used for determining the position and/or the dimension of the structure on the mask. The other one of the at least two lenses, by contrast, is used for calculating the structure to be expected in the photoresist on the wafer. Each necessary wavelength for the two lenses is adjusted in the illumination.

In further embodiments, the lenses are arranged on a slide or a turret, so that they can be quickly and easily exchanged for each necessary application—measuring the structures on a mask or calculating the structures resulting in the photoresist on the wafer. The apparatus according to the present invention is not limited to these two elements, rather, further elements are conceivable which could be used to exchange the lenses without departing from the scope of protection of the invention.

Instead, the at least two lenses could also be fixedly mounted on the apparatus according to the present invention and each be equipped with its own illumination means and have a detector associated with each of the two lenses. The advantage of this embodiment is that the lenses are always already arranged in the illumination and/or imaging beam path, because due to the high measuring accuracy of the apparatus, a conventional slide or turret does not always allow the lenses to be precisely positioned when an exchange is to be effected. Imprecise positioning of the lenses leads to imaging errors, in turn, resulting in a measuring error.

In other embodiments of the apparatus according to the present invention, the wavelengths used for imaging the structures on the mask onto the detector of the camera for determining the position and/or the dimension of the structure on the mask, on the one hand, and for calculating the structure to be expected in the photoresist on the wafer, on the other hand, are identical. For example, the single wavelength to be used can be 248 nm, 193 nm, 157 nm or 13 nm. In further embodiments, however, the wavelengths used for the two above mentioned applications are not identical, but are, for example, 365 nm for determining the position and/or the dimension of the structure on the mask, but 248 nm or 193 nm or 157 nm for calculating the structure to be expected in a photoresist on the wafer.

Moreover, in the apparatus according to the present invention, a second computer program is provided associated with the detector of the camera. The second computer program calculates each structure to be expected in the photoresist on the wafer based on the wavelength of the stepper illumination used in the stepper. On the basis of the previously obtained measuring result data with respect to the position and/or the dimension (CD) of each structure on the mask, these measuring data are compared with the structure to be expected in the photoresist on the wafer. In one embodiment, the apparatus according to the present invention comprises an evaluation electronics, associated with the detector of the camera and comprising the first computer program and the second computer program. The first and second computer programs are to be understood as subroutines and can of course be called up in a master program.

According to the above described apparatus according to the present invention, the invention also provides a method for measuring structures on a mask and for calculating the structures in a photoresist on a wafer to be expected from the structures on the mask, which will be described in the following.

In the method according to the present invention, at least one incident-light illumination means and/or one transmitted-light illumination means is used to illuminate at least one structure on the mask for semiconductor manufacture. As already described above, in one embodiment, the at least one incident-light illumination means and/or the transmitted-light illumination means can emit light in a common optical axis or, in another embodiment, a measuring stage for receiving the mask and for accessing the structures on the mask can be provided, which is interferometrically controllable and traversable in a plane vertical and relative to the optical axis.

Each selected structure on the mask is imaged onto a detector of a camera by means of an imaging optics. As already described, according to one embodiment, the camera can be a CCD camera sensitive to light in wavelengths equal to or smaller than 400 nm.

Moreover, for measuring each selected structure on a mask with respect to its position and/or dimension, the values are obtained by means of a first computer program associated with the detector of the camera.

In the method according to the present invention, each selected structure on the mask is illuminated with the at least one imaging optics while using a wavelength of a stepper illumination used in a stepper. As already described above, in various embodiments, the at least one imaging optics can comprise at least two lenses, which are adjusted depending on the application and which are brought into the optical axis, wherein the lenses are mounted on a slide or a turret in preferred embodiments. In the further embodiments, as described above, the wavelength used for the two applications are identical or not identical with the above indicated specific wavelengths.

The method according to the present invention allows the structure to be expected in the photoresist on the wafer to be calculated with reference to the wavelength of the stepper illumination used in the stepper. The image of the structure on the mask on the detector of the camera is used by a second computer program to calculate the width of the structure. The structure to be expected in the photoresist on the wafer due to the stepper illumination and the position or width (CD) determined due to the image of the structure on the mask are compared with each other to evaluate how the structure will be developed in the photoresist on the wafer. To do this, first all positions or widths of the structures on the mask can be determined and stored in a database. In an analogous fashion, the calculation of the structures to be expected in the photoresist on the wafer can be carried out. The comparison can be subsequently carried out. In one embodiment of the method according to the present invention, further steps are provided especially for structures having defects. These steps will be described in the following. In one step, the data on the position of the structures on a mask are first transferred from the evaluation electronics to a control of the measuring stage. In a further step, each defective structure on the mask is brought into the optical axis by the control of the measuring stage. In the next step, each defective structure on the mask is illuminated with the at least one imaging optics using the wavelength of the stepper illumination used in the stepper. In the next step, each defective structure on the mask is imaged onto the detector of the camera by means of the at least one imaging optics. In the next step, the structure to be expected in the photoresist on the wafer is calculated with reference to the wavelength used in the stepper illumination and with reference to the image of each defective structure on the mask on the detector of the camera with the aid of the second computer program. Then, in the final step, in case the resulting data for each structure to be expected in the photoresist on the wafer deviates from a predetermined setpoint structure in the photoresist on the wafer, a corresponding message is output, wherein the setpoint value may be within a predefined tolerance range. In a further embodiment of the method according to the present invention, it is provided in an additional step, that in case such a message is output, the mask is forwarded to repair. Such an additional testing method for defective structures on the mask makes perfect sense, because it cannot usually be predicted that defective structures on the mask always result in defective structures or in similar defective structures in the photoresist on the wafer.

The immediate comparison of measuring values with different illuminations under otherwise the same evaluation conditions therefore allows an extended analysis of the mask manufacturing processes. Further advantages of the apparatus according to the present invention and the method according to the present invention can be derived. The cost for checking defective structures on the mask or in the photoresist on the wafer is reduced, since no external checking measuring device, such as the AIMS, is necessary. The checking method with respect to defective structures is simplified, since all steps of the above described method are within one and the same process line. Since the substrate/the wafer/the mask is no longer transferred between two different apparatuses, the risk of destruction of the substrate/the wafer/the mask during handling is reduced.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

The apparatus according to the present invention and the method according to the present invention will be described in the following with respect to the schematic drawings, wherein.

DETAILED DESCRIPTION OF THE PREFERRED EMBODIMENTS

Figure 1:
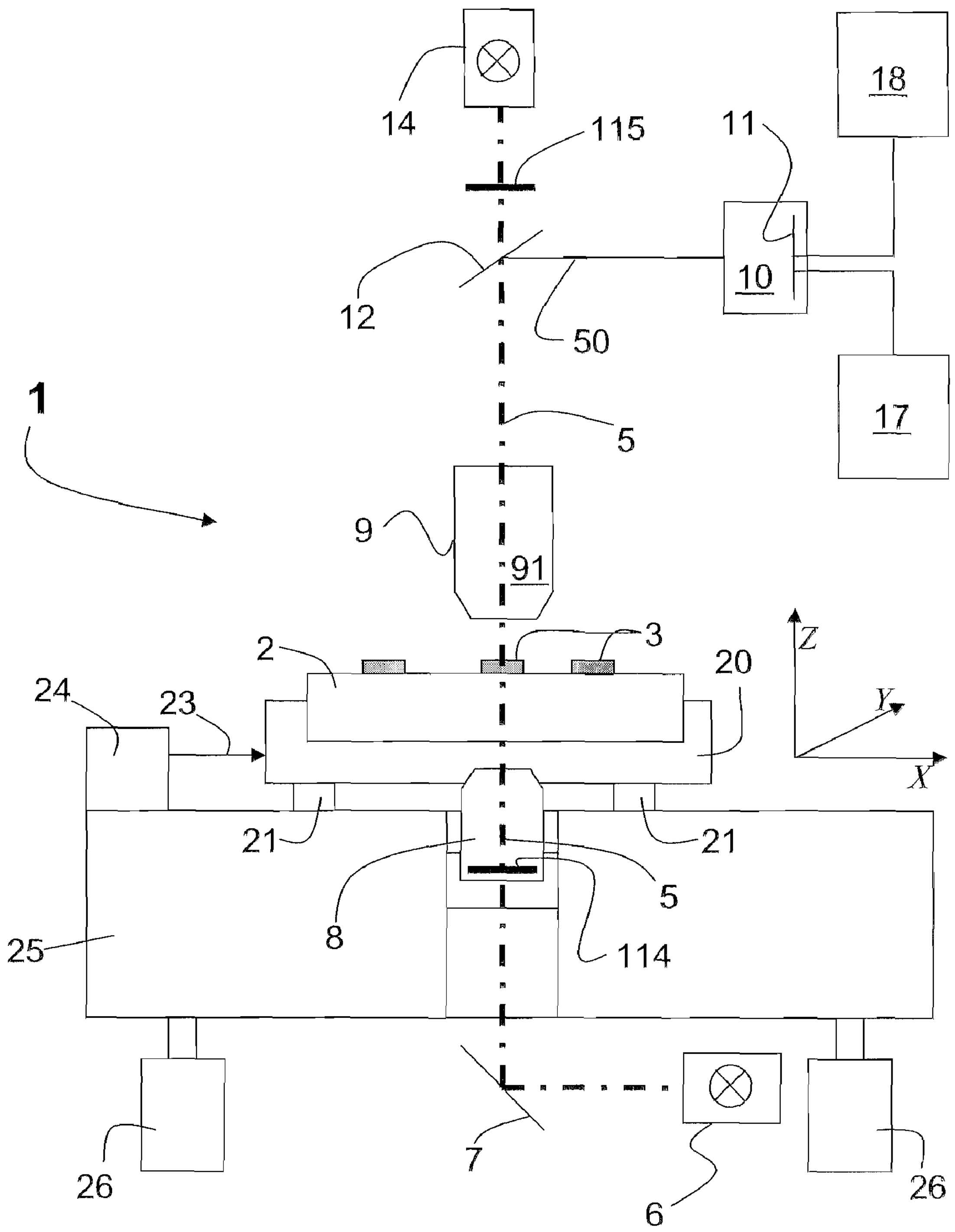
FIG. 1 is a schematic view of a first embodiment of the apparatus according to the present invention.

FIG. 1 is a schematic view of a first embodiment of apparatus 1 according to the present invention, which is a coordinate measurement machine, as it has been known for some time from the prior art for measuring structures 3 on masks and/or wafers. The exemplary embodiment shown in FIG. 1 of apparatus 1 allows substrates to be optically inspected and measured. The substrate according to the present invention is a mask 2, for example of quartz glass. Mask 2 is used for the manufacturing of semiconductors, such as wafers. A plurality of structures 3 are applied to mask 2, which can be measured with the aid of apparatus 1. Apparatus 1 comprises an optical axis 5. A transmitted-light illumination means 6 is provided for the transmitted-light mode, which emits light in the near UV or DUV and passes the light via a mirror 7 towards a condenser 8. The light in optical axis 5 passes through substrate 2 and is at least substantially collected by an imaging optics 9 having a lens 91 and imaged onto a detector 11 of a camera 10 via a beam splitter 12.

Detector 11, in the embodiment shown here, is a CCD chip for converting the optical signals collected by imaging optics 9 into electric signals. Further, in the incident-light beam path of optical axis 5, an incident-light illumination means 14 is also provided, a substantial portion of which passes beam splitter 12, and with which mask 2 or structures 3 upon mask 2 can be illuminated via illumination optics 9. Illumination optics 9 is equipped with a focusing means (not shown) for moving illumination optics 9 in the Z coordinate direction. This is how structures 3 on mask 2 may be recorded by imaging optics 9 in different focusing planes. In the same manner it is possible to displace condenser 8 in the Z coordinate direction.

Imaging optics 9 is a high-resolution, apo-chromatically corrected microscope optics which is configured for light in the UV range or light of the wavelength equal to or smaller than 400 nm.

Usually apparatus 1 has a means in the form of a filter 114 and 115 arranged on the one hand in the lower illumination beam path of optical axis 5 and on the other hand in the upper illumination beam path of optical axis 5. Filters 114 and 115 are transmission filters. Filters 114, 115 allow, for example, the desired illumination mode to be adjusted with respect to the wavelength. The high-resolution CCD chip of detector 11 is connected to an evaluation electronics 16 to read out the data obtained by the CCD chip of detector 11, which can then be processed by a first computer program 17. Evaluation electronics 16 is also for controlling a measuring stage 20 in the Y coordinate direction and the X coordinate direction.

Mask 2 is on measuring stage 20, which is moveably supported, as already mentioned, in the X and Y coordinate directions. The movement of measuring stage 20 is via air bearings 21. A laser interferometer system 24 is only schematically indicated, allowing the position of measuring stage 20 to be interferometrically determined by means of a light beam 23. Thus, the displacement of measuring stage 20 is interferometrically controlled. Measuring stage 20 is positioned on a granite block 25 by means of air bearings 21 in a substantially frictionless manner and can therefore be moved in the X and Y coordinate directions. Granite block 25 itself rests on vibration-damped legs 26.

Illumination means 6 and 14 can be energized independently of each other. For the evaluation of the printed patterns, i.e. for calculating the structure to be expected in the photoresist on the wafer, light sources are provided to emit light at a wavelength of 248 nm, or 193 nm, or 157 nm, or 13 nm. Imaging optics 9 of apparatus 1 is matched to the corresponding wavelength. A second computer program 18 at evaluation electronics 16 is provided for evaluating the data obtained by means of CCD camera 10, wherein evaluation electronics 16 calculates a structure or a pattern to be expected in the photoresist from structures 3 imaged on mask 2 under stepper conditions.

Figure 3:
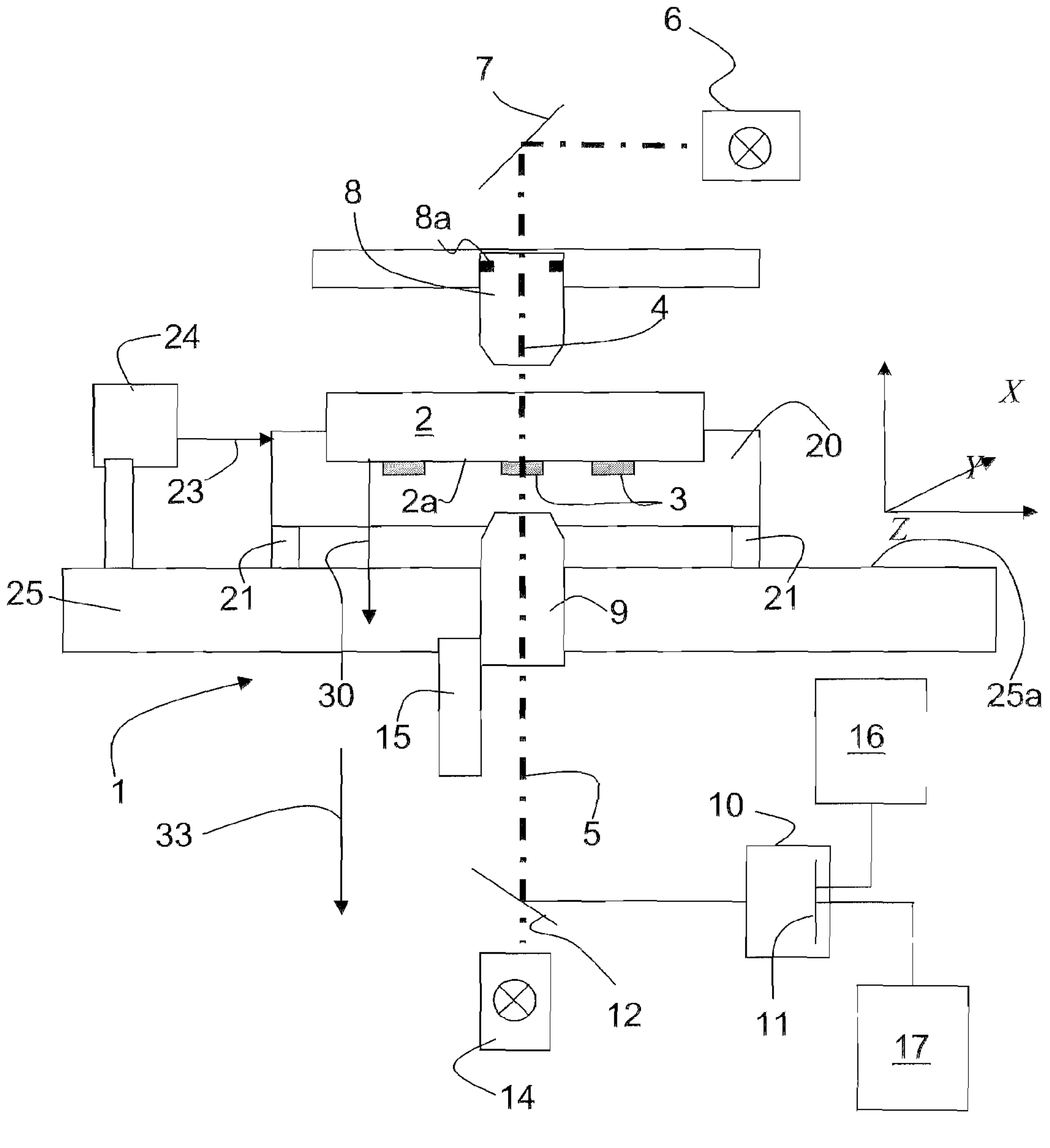
FIG. 3 is a schematic view of an embodiment of the apparatus according to the present invention, wherein the substrate to be measured is inserted with the structures facing down.

The determination of structural widths of the positions or widths of structures 3 on mask 2 is strongly dependent on mechanical deformations, i.e. the bending of mask 2. It is this bending effect which must be calculated out, or the measured values must be corrected, in the determination of the position of structural width. Hitherto unpublished patent application DE 10 2007 028 260 discloses a further embodiment of apparatus 1 (cf. FIG. 3), wherein mask 2 is inserted in measuring stage 20 in such a way, that a normal vector 30 extending from the surface of mask 2 bearing structures 3 is essentially parallel to vector 33 of the force of gravity. This arrangement shown in FIG. 3 has the particular advantage that when measuring the positions of structures 3 the same bending effects are prevalent as with a mask 2 inserted in a wafer stepper or wafer scanner. When calculating the position and/or dimension of structure 3 on wafer 2 it is also advantageous to distribute the support points of mask 2 on measuring stage 20 in such a way that their distribution corresponds to the distribution of support points as they are used in the wafer stepper or wafer scanner. Furthermore, it is advantageous if the same measuring stage 20 or the same support for the masks 2 or the substrates is used as in the wafer stepper or wafer scanner.

Figure 2:
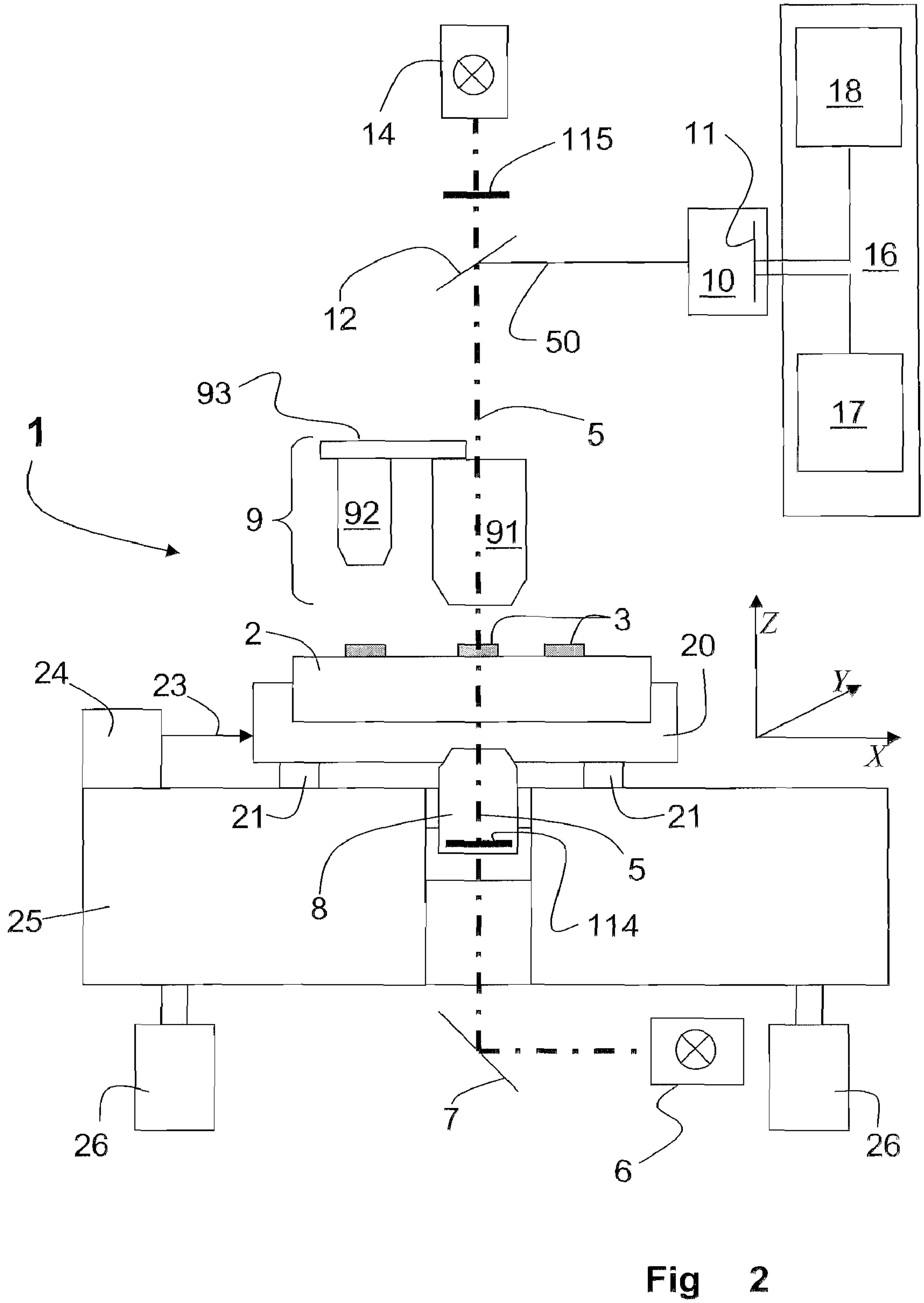
FIG. 2 is a schematic view of a second embodiment of the apparatus according to the present invention.

FIG. 2 shows a second embodiment of the invention configured according to FIG. 1. In addition to lens 91, imaging optics 9 of apparatus 1 comprises at least one further lens 92. The at least two lenses 91, 92 are arranged on a slide 93 in the embodiment shown in FIG. 2. Depending on each wavelength used, this is how a suitable lens 91 or 92 can be brought into the beam path of optical axis 5 of apparatus 1. If the position and/or the CD of the structures on a mask 2 are to be determined, a wavelength in the near UV range or light of the wavelength of equal to or smaller than 400 nm is used, which is larger than the wavelength used in the stepper. If the printed pattern is to be evaluated, i.e. the structure to be expected in the photoresist on the wafer is to be calculated, lens 91 or 92 formed for the wavelength to be used in a stepper, is brought into the beam path of the apparatus.

Finally, it should be noted that the invention has been described with reference to preferred embodiments. It will be understood by a person skilled in the art, however, that modifications and changes can be made without departing from the scope of protection of the appended claims.

What is claimed is:

1. An apparatus for measuring structures on a mask and for predicting wafer photoresist structures produced by stepper illumination of the structures on the mask, comprising:

- an incident-light illumination means illuminating the structures or a transmitted-light illumination means illuminating the structures;
- an imaging optics for imaging the illuminated structures on the mask using a stepper illumination wavelength;
- a camera comprising a detector for imaging the structures on the mask; and
- an electronic computer connected with the detector, the computer simultaneously running
  - a first computer program processing output of the camera detector to determine positions or dimensions of the structures on the mask and
  - a second computer program processing output of the camera detector to predict the wafer photoresist structures produced by the stepper illumination.

2. The apparatus according to claim 1, wherein incident-light illumination light and transmitted-light illumination light propagate via a common optical axis.

3. The apparatus according to claim 1, wherein the apparatus further comprises a movable measuring stage for the mask, wherein the position of the measuring stage is monitored interferometrically.

4. The apparatus according to claim 1, further comprising evaluation electronics connected with the camera detector and comprising said first computer program and said second computer program.

5. The apparatus according to claim 1, wherein the camera is a CCD camera sensitive to light having a wavelength equal to or smaller than 400 nm.

6. The apparatus according to claim 1, wherein the imaging optics comprises at least two lenses, which can be brought into the optical axis depending on whether the positions or dimensions of the structures on the mask are to be determined or the wafer photoresist structures are to be predicted.

7. The apparatus according to claim 6, further comprising a slide or a turret, wherein the lenses are mounted on the slide or the turret.

8. The apparatus according to claim 1 comprising at least two illuminations means and at least two detectors, wherein the imaging optics comprises at least two fixedly mounted lenses, each lens located on the same optical path with its respective illumination means and its respective detector.

9. The apparatus according to claim 1, wherein the wavelength used for illuminating the structures on the mask to determine the positions or the dimensions of the structures on the mask is the wavelength used for illuminating the structures on the mask to predict the wafer photoresist structures.

10. The apparatus according to claim 9, wherein the wavelength is 248 nm, 193 nm, 157 nm, or 13 nm.

11. The apparatus according to claim 10, wherein the at least one illumination means comprises an Excimer laser.

12. The apparatus according to claim 1, wherein the wavelength used for illuminating the structures on the mask to determine the positions or the dimensions of the structures on the mask is 365 nm. and the wavelength used for illuminating the structures on the mask to predict the wafer photoresist structures is 248 nm, or 193 nm, or 157 nm.

13. A method for measuring structures on a mask for semiconductor manufacture and for predicting wafer photoresist structures produced by stepper illumination of structures on the mask, comprising the following steps:

- illuminating the structures on the mask with at least one incident-light illumination means or a transmitted-light illumination means;
- imaging the structures with a detector of a camera using at least one imaging optics;
- determining positions or dimensions of the structures on the mask with a first computer program processing output of the camera,
- illuminating the structures through at least one imaging optics using a wavelength of the stepper illumination; and
- predicting wafer photoresist structures produced by the stepper illumination with a second computer program processing output of the camera,
- wherein the first computer program and the second computer program are running simultaneously.

14. The method according to claim 13, wherein incident-light illumination light and transmitted-light illumination light propagate via a common optical axis.

15. The method according to claim 13 wherein the mask is placed on a movable interferometrically controllable measuring stage.

16. The method according to claim 13, wherein said first computer program and said second computer program are executed in an evaluation electronics connected with the detector of the camera.

17. The method according to claim 13, wherein the imaging optics comprises at least two fixedly mounted lenses, each lens located on the same optical path with its respective illumination means and its respective detector.

18. The method according to claim 13, wherein the wavelength used for illuminating the structures on the mask to determine the positions or the dimensions of the structures on the mask is the wavelength used for illuminating the structures on the mask to predict the wafer photoresist structures.

19. The method according to claim 18, wherein the wavelength is 248 nm, 193 nm, 157 nm, or 13 nm.

20. The method according to claim 19, wherein the at least one illumination means comprises an Excimer laser.

21. The method according to claim 13, wherein the wavelength used for illuminating the structures on the mask to determine the positions or the dimensions of the structures on the mask is 365 nm, and the wavelength used for illuminating the structures on the mask to predict the wafer photoresist structures is 248 nm. or 193 nm, or 157 nm.

22. The method according to claim 13, comprising the following further steps:

transmitting the position of the structures on the mask from evaluating electronics to a control of a measuring stage, bringing each defective structure on a mask into an optical axis by controlling the measuring stage;

illuminating each defective structure on the mask with the at least one imaging optics using the wavelength of the stepper illumination;

imaging each defective structure on the mask with the detector of the camera using the at least one imaging optics;

predicting wafer photoresist structures produced by the stepper illumination of each defective structure on the mask with the second computer program; and if the predicted wafer photoresist structure deviates from a reference wafer photoresist structure, outputting a message.

23. The method according to claim 22, wherein after the message is output, the mask is delivered to a repair process.

* * * * *